(12) United States Patent
Hsiao

(10) Patent No.: US 7,821,788 B2
(45) Date of Patent: Oct. 26, 2010

(54) HEAT DISSIPATION DEVICE

(75) Inventor: Yi-Liang Hsiao, Taoyuan (TW)

(73) Assignee: Micro-Star Internationa'l Co., Ltd., Jung-He (TW)

( * ) Notice: Subject to any disclaimer, the term of this patent is extended or adjusted under 35 U.S.C. 154(b) by 0 days.

(21) Appl. No.: 12/505,630

(22) Filed: Jul. 20, 2009

(65) Prior Publication Data

US 2009/0277620 A1 Nov. 12, 2009

Related U.S. Application Data

(62) Division of application No. 11/426,296, filed on Jun. 23, 2006, now Pat. No. 7,580,259.

(30) Foreign Application Priority Data

Jun. 24, 2005 (TW) ............................... 94121289 A

(51) Int. Cl.
H05K 7/20 (2006.01)
(52) U.S. Cl. .................................. 361/695; 361/679.48
(58) Field of Classification Search ............ 361/679.48, 361/695
See application file for complete search history.

(56) References Cited

U.S. PATENT DOCUMENTS

| | | | |
|---|---|---|---|
| 5,777,848 A | 7/1998 | McAnally et al. | |
| 5,835,347 A | 11/1998 | Chu | |
| 5,854,738 A | 12/1998 | Bowler | |
| 5,973,921 A | 10/1999 | Lin | |
| 6,104,609 A | 8/2000 | Chen | |
| 6,134,115 A | 10/2000 | Sim et al. | |
| 6,269,001 B1 | 7/2001 | Matteson et al. | |
| 6,327,148 B1 | 12/2001 | Tucker et al. | |
| 6,587,342 B1 * | 7/2003 | Hsu | 361/695 |
| 6,672,374 B1 | 1/2004 | Lin | |
| 6,775,139 B2 | 8/2004 | Hsueh | |
| 6,894,898 B2 | 5/2005 | Liu | |
| 6,950,306 B2 | 9/2005 | Huang et al. | |
| 7,054,155 B1 | 5/2006 | Mease et al. | |
| 7,133,288 B2 | 11/2006 | DelPrete et al. | |
| 7,236,361 B2 | 6/2007 | Cote et al. | |
| 7,633,755 B2 * | 12/2009 | Zhou et al. | 361/697 |

(Continued)

FOREIGN PATENT DOCUMENTS

TW 579003 3/2004

(Continued)

*Primary Examiner*—Anatoly Vortman
(74) *Attorney, Agent, or Firm*—Workman Nydegger

(57) ABSTRACT

A heat dissipation device for dissipating heat from a plug-in electronic component, such as a memory is provided. The heat dissipation device includes a base frame, a moving frame, and a retaining cover. The base frame is disposed at one side of the electronic component. The moving frame is movably mounted on the base frame. A heat dissipation fan is mounted on the retaining cover, and the retaining cover is also movably mounted on the moving frame. In this manner, the heat dissipation fan has at least a retraction position where the heat dissipation fan is not overlaid above the electronic components so as to plug or remove the electronic component, and a heat dissipation position where the heat dissipation fan dissipates heat from the corresponding electronic component. Furthermore, the heat dissipation position changes in accordance with actual heat dissipation requirements, thereby providing an optimal heat dissipation mode.

8 Claims, 10 Drawing Sheets

U.S. PATENT DOCUMENTS

| | | |
|---|---|---|
| 2003/0188847 A1 | 10/2003 | Lai et al. |
| 2004/0121719 A1* | 6/2004 | Robison et al. ............. 454/143 |
| 2008/0041561 A1* | 2/2008 | Zhou et al. ................. 165/80.3 |
| 2008/0101021 A1* | 5/2008 | Sanchez et al. ............ 361/695 |

FOREIGN PATENT DOCUMENTS

| | | |
|---|---|---|
| TW | M247906 | 10/2004 |
| TW | M263549 | 5/2005 |
| TW | M265698 | 5/2005 |

* cited by examiner

HEAT DISSIPATION DEVICE

CROSS-REFERENCE TO RELATED APPLICATIONS

This non-provisional application is a divisional of U.S. patent application Ser. No. 11/426,296 filed Jun. 23, 2006 which claimed priority under 35 U.S.C. §119(a) on patent application no. 094121289 filed in Taiwan, R.O.C. on Jun. 24, 2005, the entire contents of which are hereby incorporated by reference.

BACKGROUND OF THE INVENTION

1. Field of Invention

The present invention relates to a heat dissipation device for dissipating heat from a heat-generating source, such as an electronic component. More particularly, the present invention relates to a heat dissipation device for a plug-in electronic component, such as a memory.

2. Related Art

Computer system has become a main auxiliary tool for human beings due to its capability of doing a large amount of works such as operation and data storage. Along with continuous progress of science and technology, the computer system has been greatly improved in the aspect of operational efficiency and memory capacity. The computer system is composed of many electronic components, and while operating, the electronic components generate high temperature heat. In order to keep normal operation of the electronic components, heat dissipation has become a crucial issue to be solved under the condition of the continuous improvement of operating efficiency.

For example, a desktop computer mainly comprises electronic components including a motherboard, a CPU, a hard disk drive, an optical disk drive, various interface cards, a power supply, and the like. Among the electronic components, CPU is the crucial logic operation element. Currently, various heat dissipation designs are mainly directed to the CPU. The heat generated from other electronic components is dissipated by a heat dissipation fan disposed on the computer case. However, along with the improvement of operational efficiency of the CPU, other electronic components are improved. For example, the memory registers operational data or relevant programs and continuously accesses during the operation of CPU, and thus the working temperature generated is extremely high. In order to prevent the normal operation of memory from being affected by high temperature, it is necessary to individually dissipate heat from the memory.

Memory is a plug-in element and users can change the memory capacity at will, so the design of the heat dissipation device of the memory must avoid obstructing the plugging or removing of the memory. A heat dissipation device for memory has been disclosed in Taiwan Patent Publication No. M265698, Taiwan Patent Publication No. M263549, Taiwan Patent Publication No. M247906, and U.S. Pat. No. 6,775,139, in which a frame design, slightly longer than a memory socket, is adopted. The frame can be selectively buckled on the memory socket or apart from the memory socket. A plurality of heat dissipation fans are disposed on the frame and can be used to dissipate heat from the memory when the frame is buckled on the memory socket. If it is intended to replace the memory, the user needs to detach the whole frame to plug or remove the memory.

The above-mentioned patent applications achieve a heat dissipation device design to dissipate heat from a memory. However, since the frame spans over the memory socket and legs are disposed at two sides of the frame, when detaching the frame, the frame cannot be detached unless pushing the legs at the two sides in sync. Similarly, when assembling the frame, the frame cannot be mounted unless pushing the legs at the two sides simultaneously, which is inconvenient when detaching and assembling. Furthermore, the heat dissipation fan is transversely disposed on the frame, and in order to provide sufficient air flow for the memory, two or three heat dissipation fans are required, which cause an increase in not only the cost of the heat dissipation fans but also in the consumption of electric energy of the system.

SUMMARY OF THE INVENTION

The foregoing and other problems are overcome and the objects and advantages are realized by the heat dissipation device in accordance with embodiments of this invention.

The heat dissipation device provides an adjustable heat dissipation device for solving the problems of prior art that the assembling and detaching of the frame are inconvenient and an increase in the cost of components due to adopting buckle design.

The heat dissipation device for dissipating heat from a plug-in memory of a computer system provided by the present invention comprises a base frame, a moving frame, a retaining cover, and a heat dissipation fan. The base frame is disposed at one side of the memory socket and has a pair of wing plates, wherein the wing plates each have a guide slot. The moving frame is movably disposed in the guild slots. The retaining cover is movably disposed on the moving frame. The heat dissipation fan is mounted on the retaining cover to move along with the moving frame and the retaining cover, such that the heat dissipation fan has at least a retraction position where the heat dissipation fan is not overlaid above the memory so as to plug or remove the memory, and a heat dissipation position where the heat dissipation fan is above the memory to dissipate heat from the corresponding memory. Based on the moving relation between the moving frame and the retaining cover, different heat dissipation positions can be further obtained to provide the optimal heat dissipation mode in accordance with the actual heat dissipation requirements.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

The heat dissipation device provided by the present invention is disposed in an electronic device to dissipate heat from a heat source (electronic component) within the electronic device. In the following detailed description, the heat dissipation design of a memory of a computer system is described as a preferred embodiment of the present invention.

The First Embodiment

Figure 1:
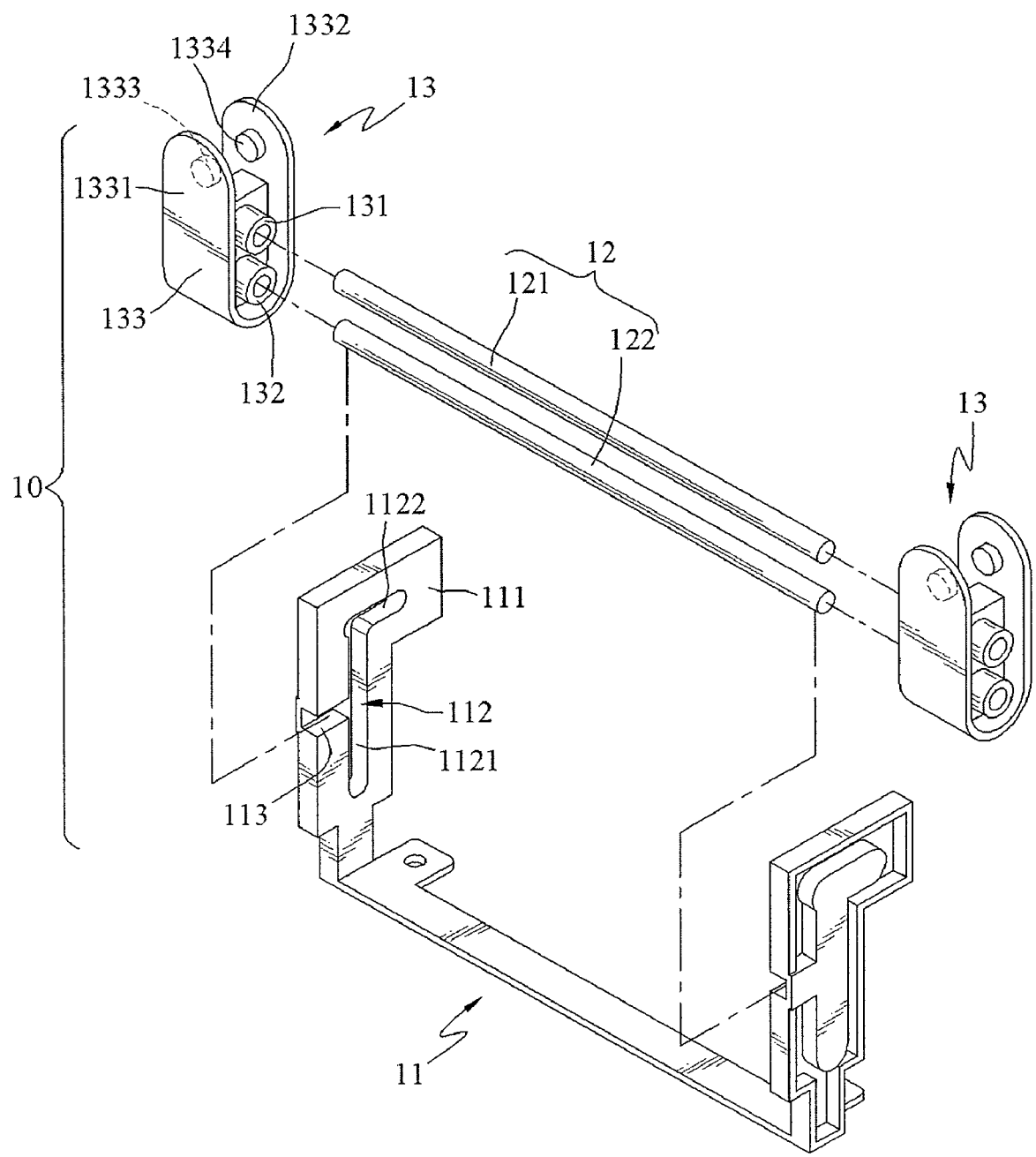
FIG. 1 is an exploded schematic view of a structure according to a first embodiment of the present invention.
Figure 2:
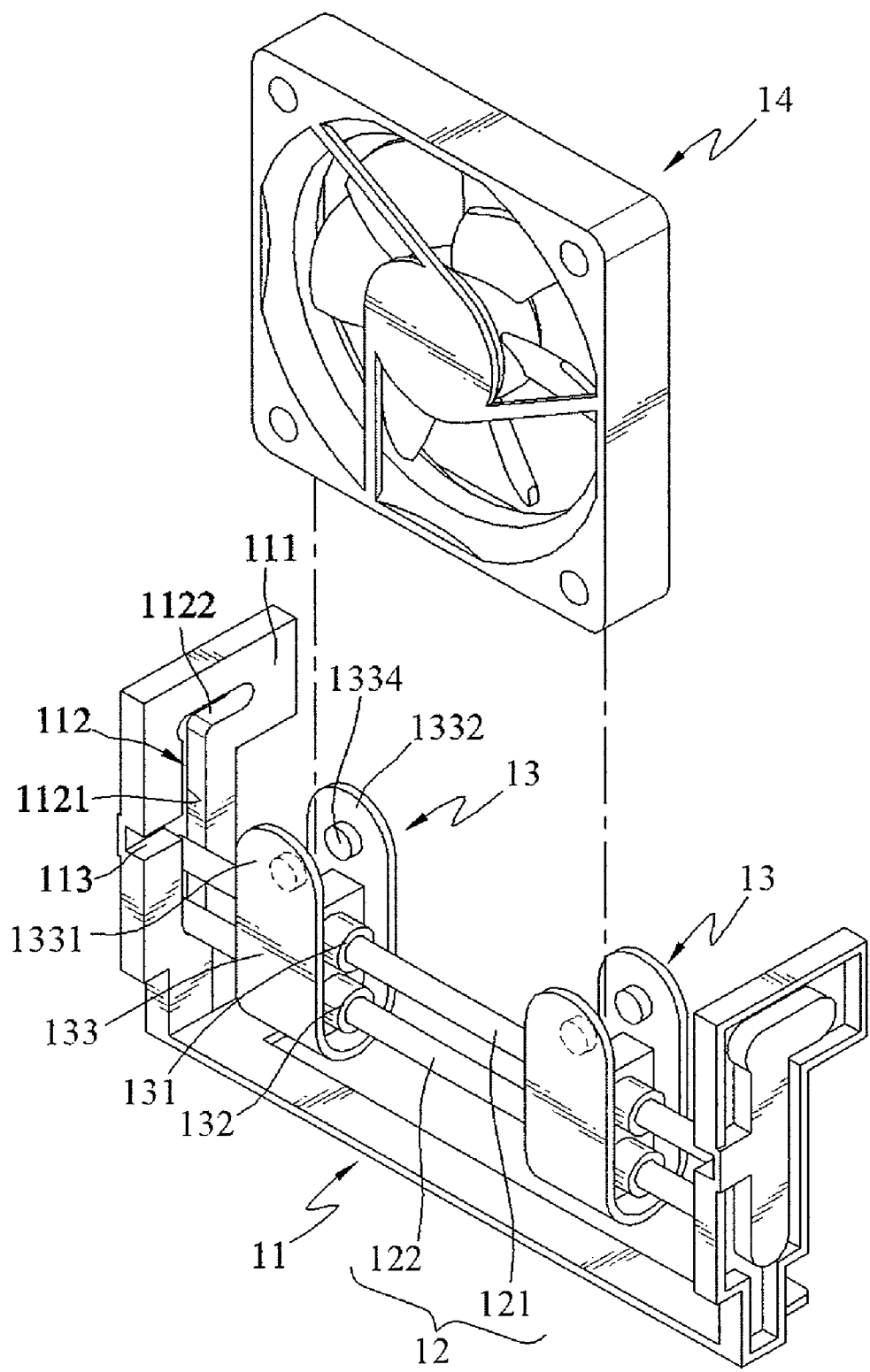
FIG. 2 is a schematic view of the assembling of the structure according to the first embodiment of the present invention.

As shown in FIGS. 1 and 2, the heat dissipation device 10 provided by the present invention comprises a base frame 11, a moving frame 12, more than one retaining covers 13, and a heat dissipation fan 14. The base frame 11 substantially assumes a U shape and has two wing plates 111 spaced a distance from each other. A guide slot 112 substantially assuming an inverted L-shape are opened in the wing plates 111 and a vertical section 1121 and a horizontal section 1122 are defined. An entrance 113 is formed at a suitable position of the guide slot 112 for getting into the guide slot 112. The moving frame 12 comprises two shafts 121 and 122. The length of two shafts 121 and 122 is approximately equal to the pitch between the two wing plates 111, such that the two shafts 121 and 122 can enter the guide slot 112 through the entrance 113 and move within the range of the guide slot 112. The retaining cover 13 comprises two sliding sleeves 131 and 132 and a jacket 133 wrapping the sliding sleeves 131 and 132. The inner diameter of the sliding sleeves 131 and 132 is slightly greater than the outer diameter of the shafts 121 and 122, such that the sliding sleeves 131 and 132 is just fitted on the shafts 121 and 122 to move on the shafts 121 and 122. The jacket 133 substantially assumes a U shape and wraps the sliding sleeves 131 and 132. Two extension ends of the jacket 133 form a retaining range which can be slightly enlarged by exerting a force. The fixing pins 1333 and 1334 are fixed on the opposite inner surfaces of the extension ends 1331 and 1332.

Figure 3:
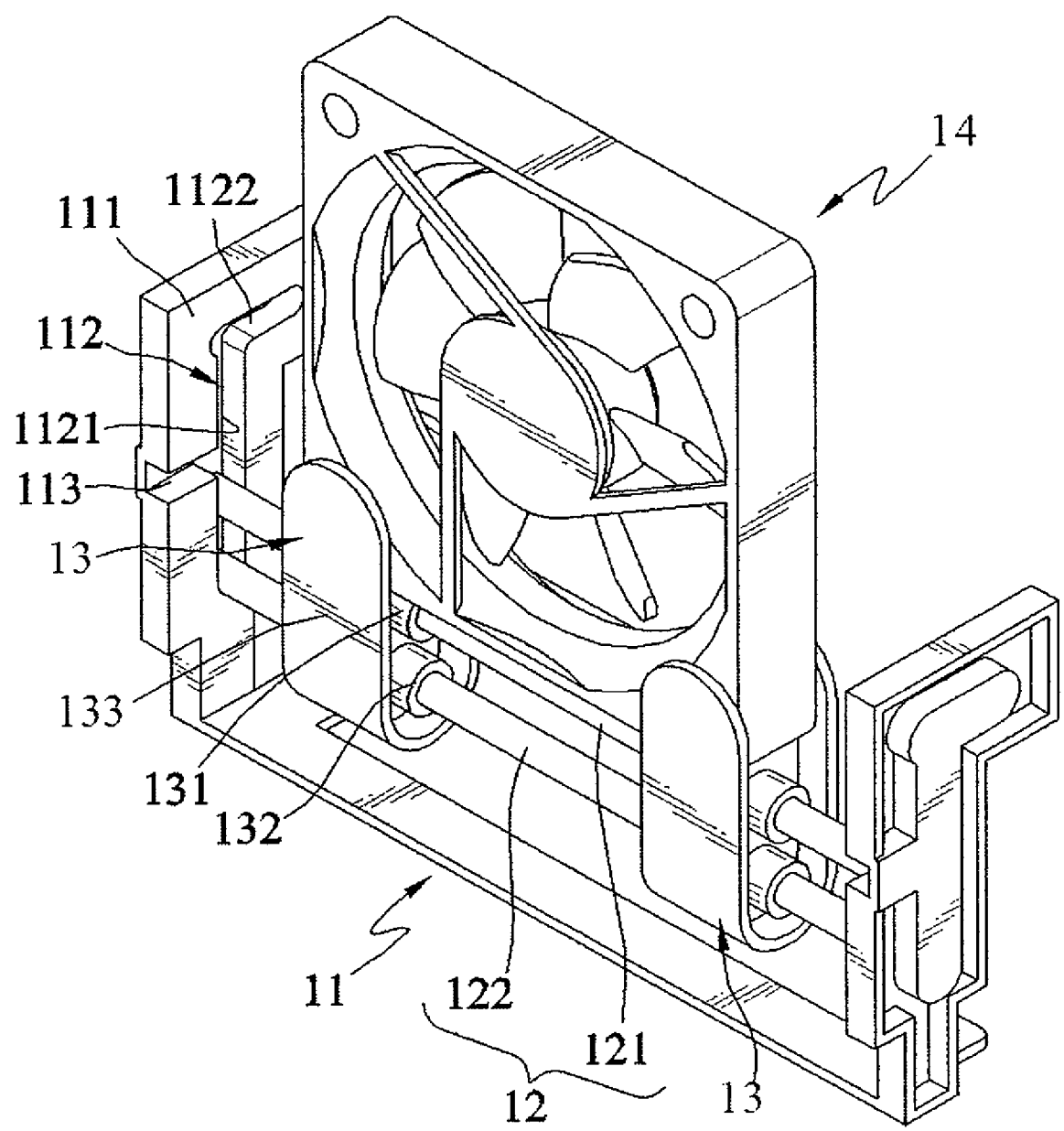
FIG. 3 is a schematic view of the application of the structure according to the first embodiment of the present invention.
Figure 4A:
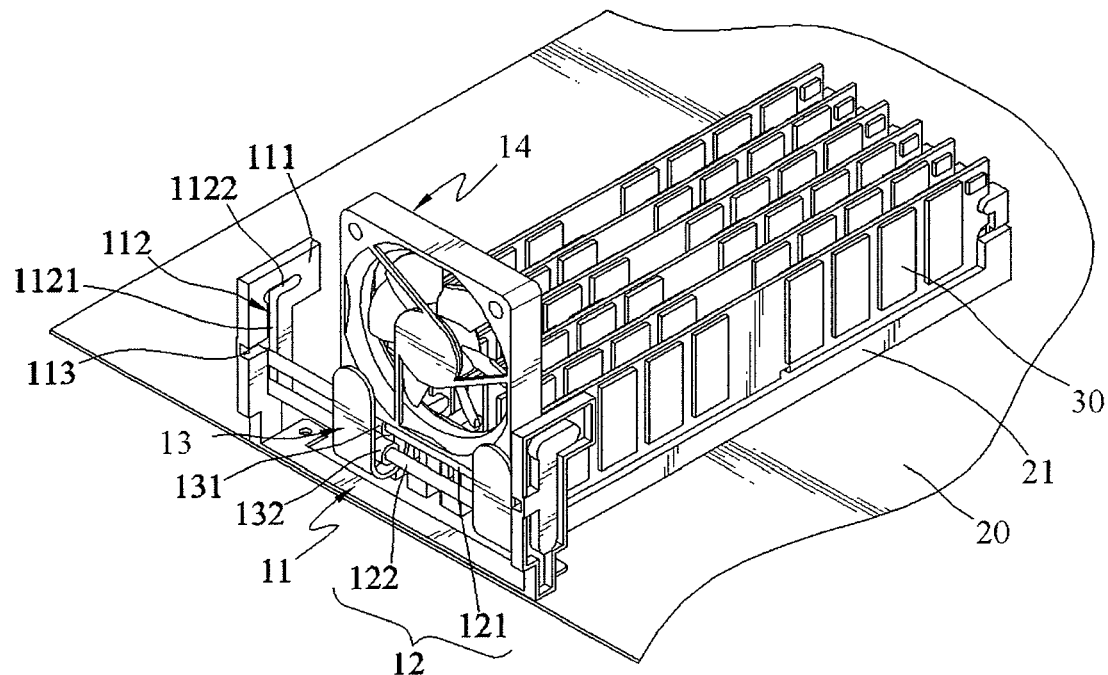
FIGS. 4A to 4D are schematic views of the aspects of the actions of the first embodiment of the present invention.
Figure 4B:
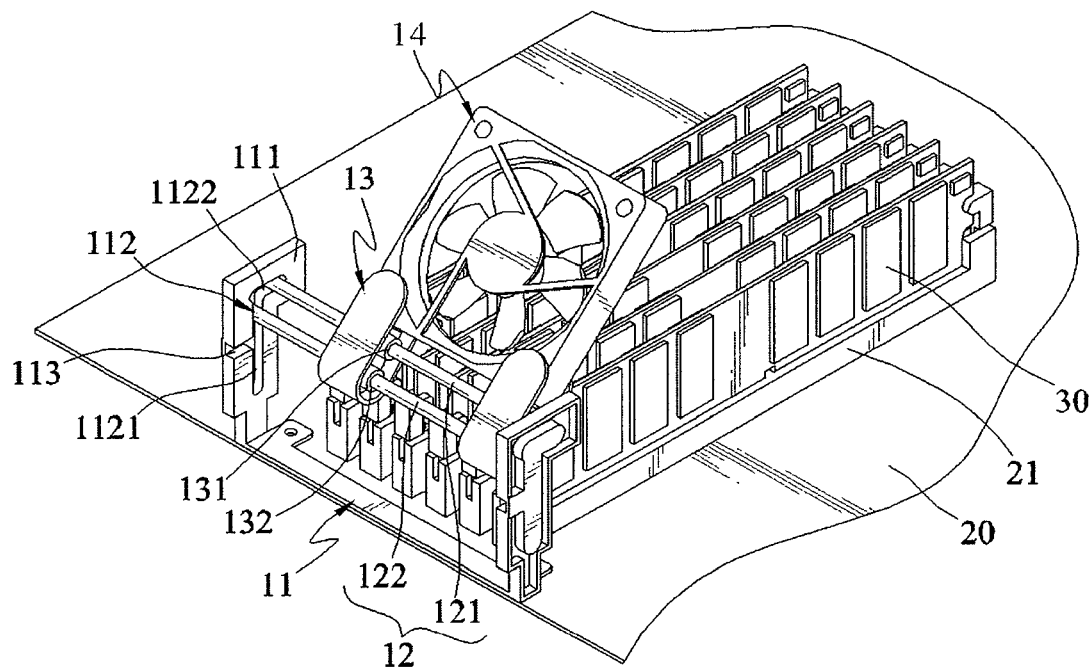
Figure 4C:
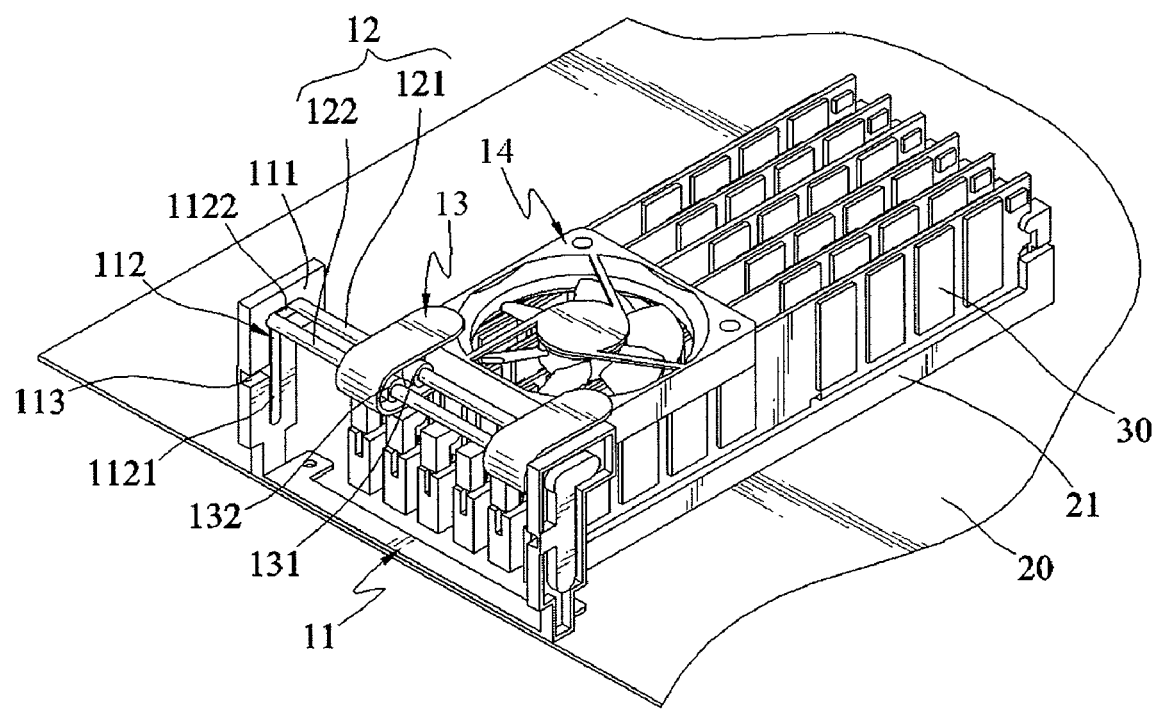
Figure 4D:
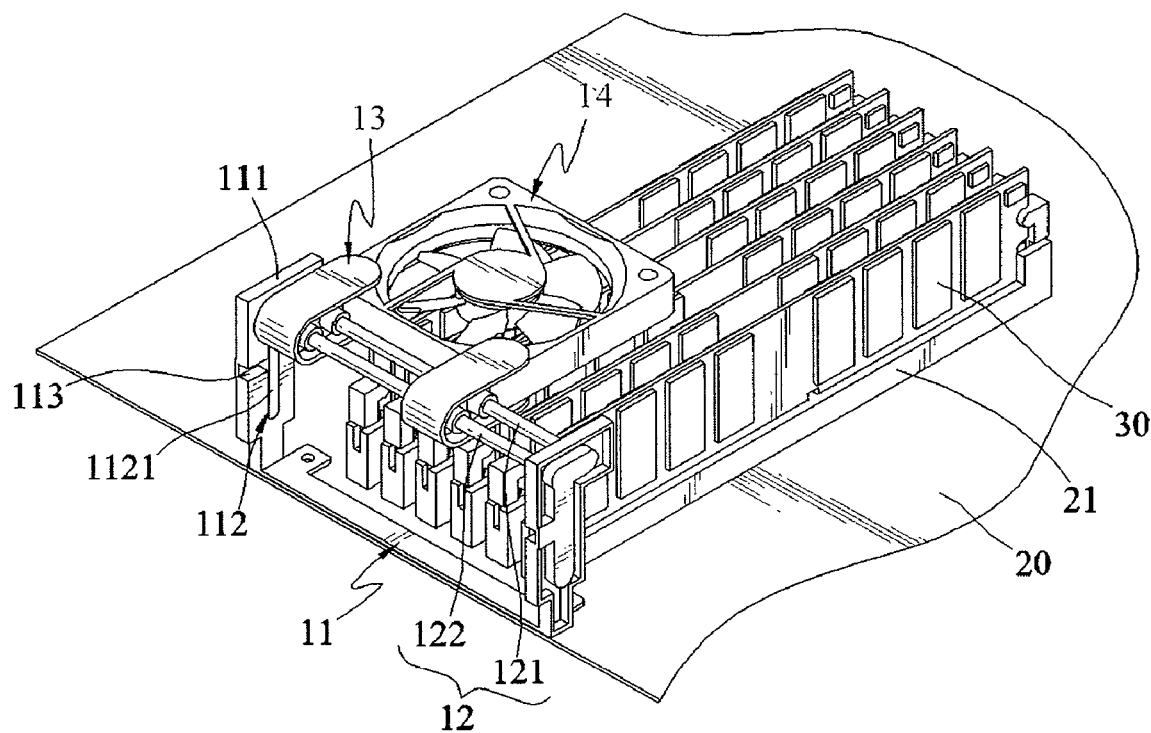

Referring to FIGS. 2 and 3 together, the base frame 11 is fixed at one side of the memory socket 21 on the motherboard 20. Firstly, two sliding sleeves 131 and 132 of the retaining covers 13 are fitted on the two shafts 121 and 122. Then, the shafts 121 and 122 are moved into the guide slot 112 from the corresponding entrance 113 of the guide slot 112. As such, the moving frame 12 can move up-and-down or to-and-fro in the guide slot 112, and the retaining covers 13 can move left and right on the moving frame 12. Finally, the retaining range of the jacket 133 is slightly enlarged to fix the heat dissipation fan 14 by the fixing pins 1333 and 1334.

FIGS. 4A to 4D, the heat dissipation fan 14 can move in the guide slot 112 by the use of the moving frame 12. When the moving frame 12 moves to the end of the vertical section 1121 of the guide slot 112, the heat dissipation fan 14 erects on the base frame 11. The memory socket 21 at this position is uncovered, a user can conveniently plug and remove the memory 30, and this position is defined to be the retraction position of the heat dissipation fan 14. When the plug-in of the memory 30 is done, the heat dissipation fan 14 is moved to make the moving frame 12 moving toward the horizontal section 1122 of the guide slot 112. When the shaft 121 of the moving frame 12 gets into the horizontal section 1122 and the shaft 122 remains in the vertical section 1221, at this position, the moving frame 12 interferes with the guide slot 112, such that the heat dissipation fan 14 is beveled to blow air flow toward the other end of the memory 30. Therefore, a single heat dissipation fan 14 can accomplish dissipating heat from the whole memory 30. This position is defined to be the first heat dissipation position of the heat dissipation fan 14. Furthermore, when the moving frame 12 completely gets into the horizontal section 1122 of the guide slot 112, at this position, the heat dissipation fan 14 is horizontally disposed above the memory 30. This position is defined to be the second heat dissipation position of the heat dissipation fan. The first heat dissipation position and the second heat dissipation position are defined to be the heat dissipation position of the heat dissipation fan 14.

Moreover, at the retraction position, the first heat dissipation position, and the second heat dissipation position, the heat dissipation fan 14 can move left and right on the moving frame 12 by the use of the retaining covers 13, thereby changing transverse positions of the retraction position, the first heat dissipation position, and the second heat dissipation position. For example, as for the motherboard 20 with multiple memory sockets 21, the optimal retraction position or heat dissipation position can be obtained by changing the transverse positions of the retraction position, the first heat dissipation position, and the second heat dissipation position of the heat dissipation fan 14.

In addition, with the design of the jacket 133 of the retaining cover 13, the heat dissipation fans 14 of different specifications can be mounted according to different heat dissipation requirements. As such, the optimal heat dissipation mode can be obtained to satisfy the actual heat dissipation requirements.

The Second Embodiment

Figure 5:
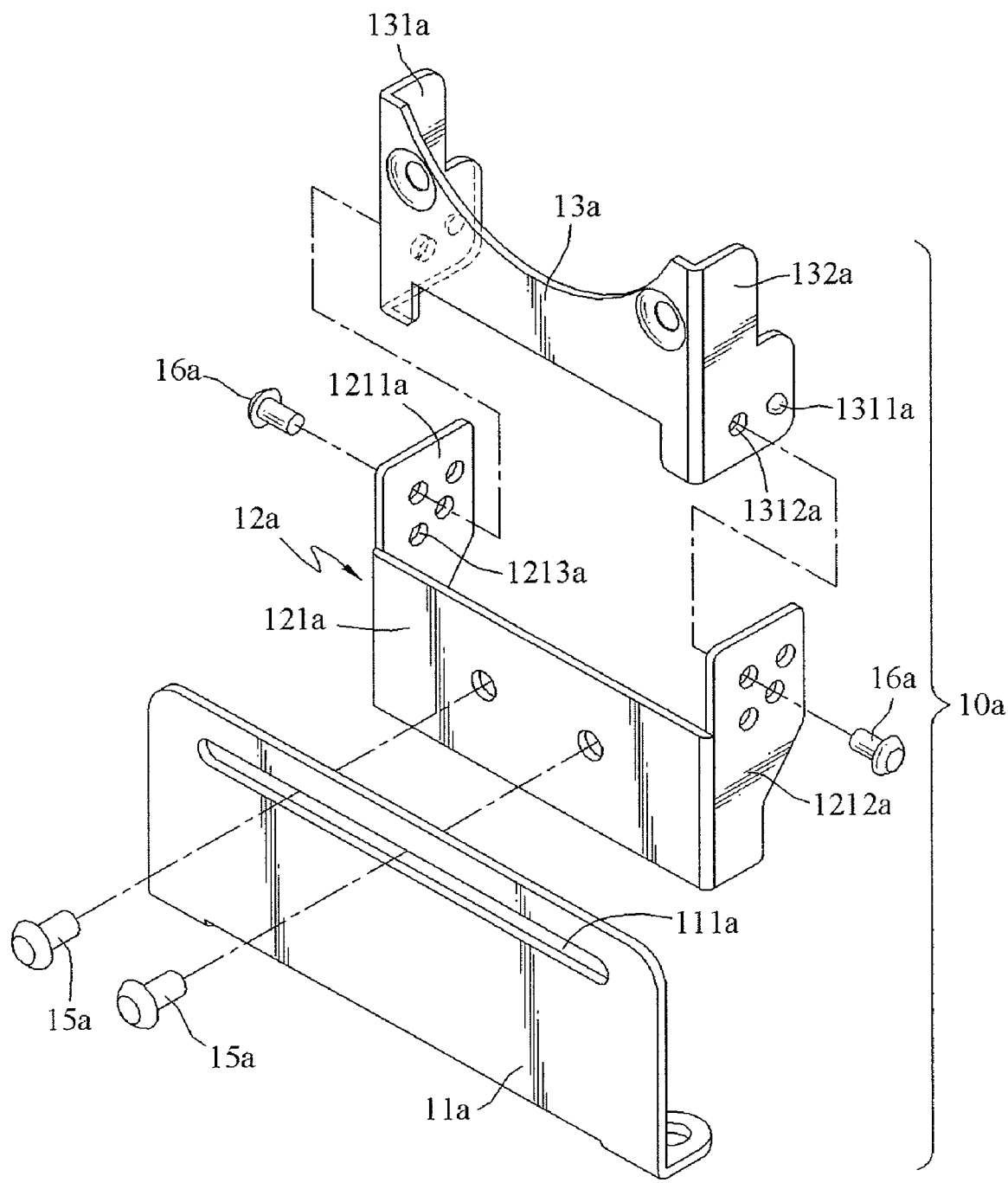
FIG. 5 is an exploded schematic view of the structure according to a second embodiment of the present invention.
Figure 6:
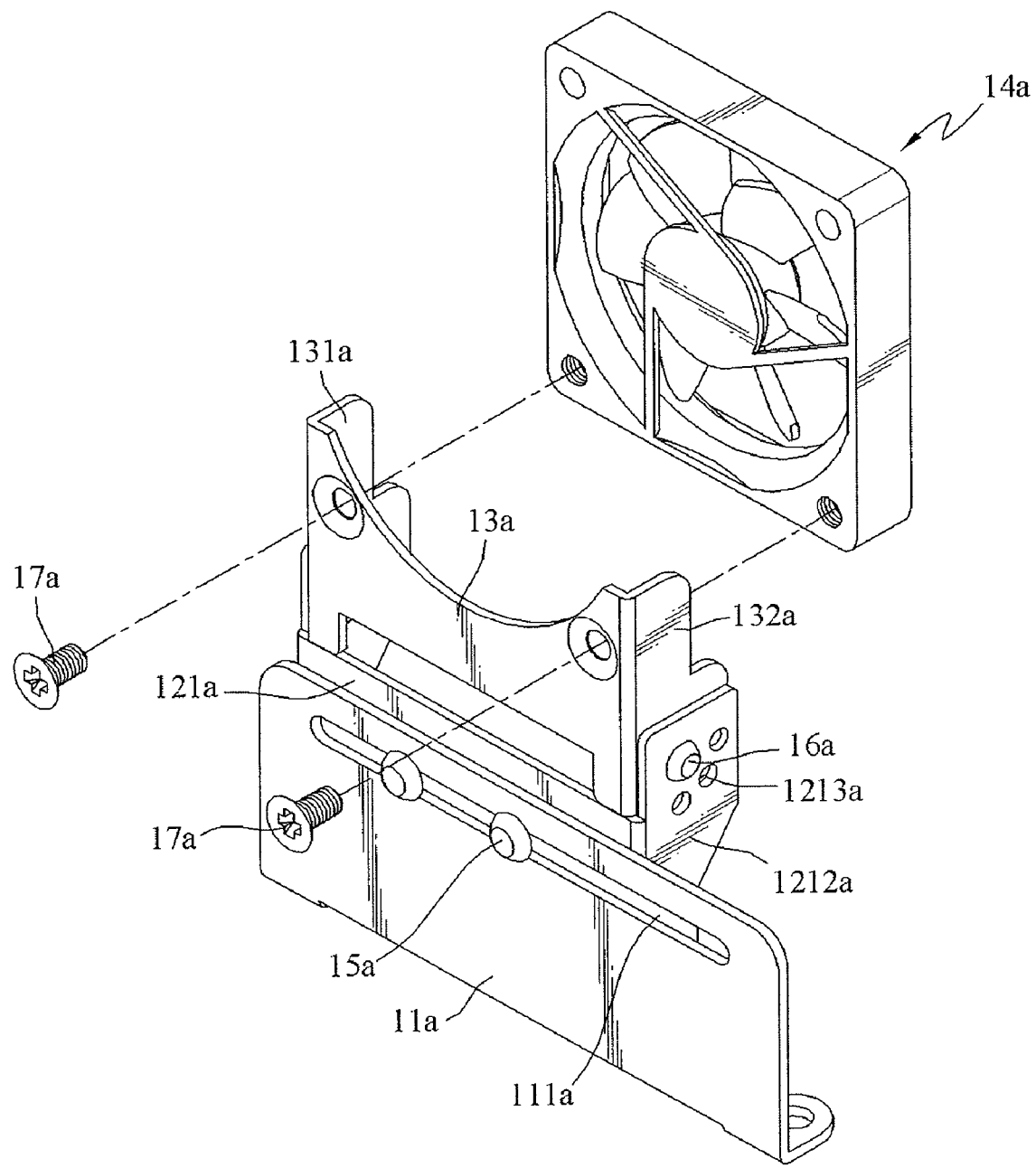
FIG. 6 is a schematic view of the assembling of the structure according to the second embodiment of the present invention.
Figure 7:
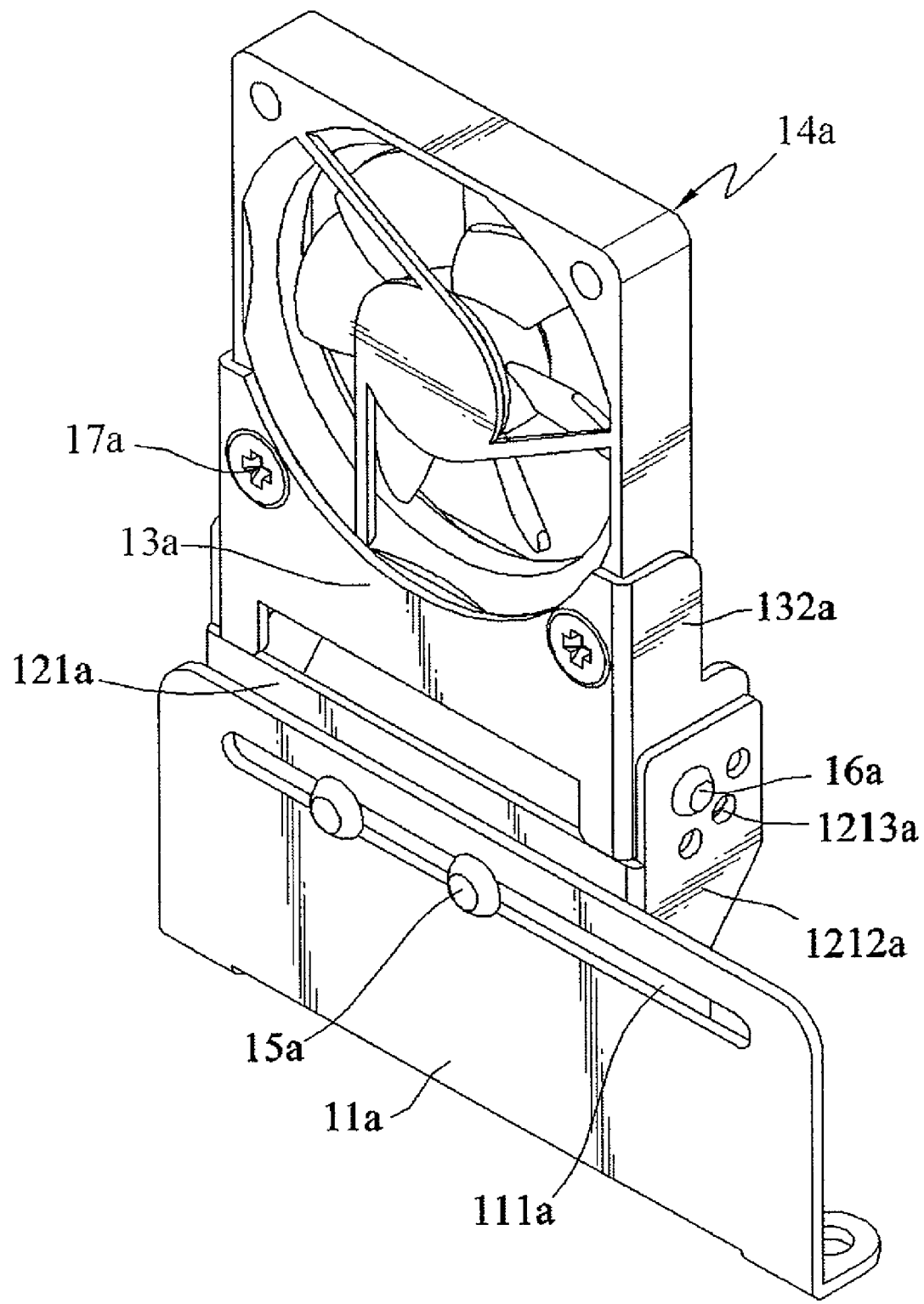
FIG. 7 is a schematic view of the application of the structure according to the second embodiment of the present invention.
Figure 8A:
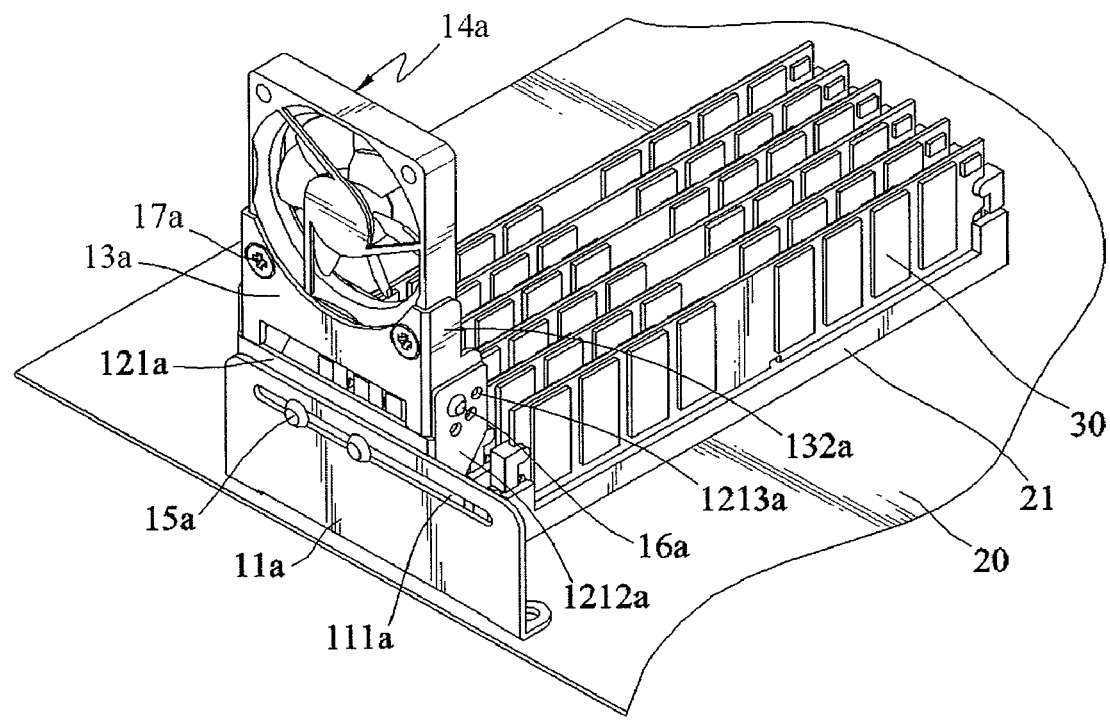
FIGS. 8A to 8D are schematic views of the aspects of the actions of the second embodiment of the present invention.
Figure 8B:
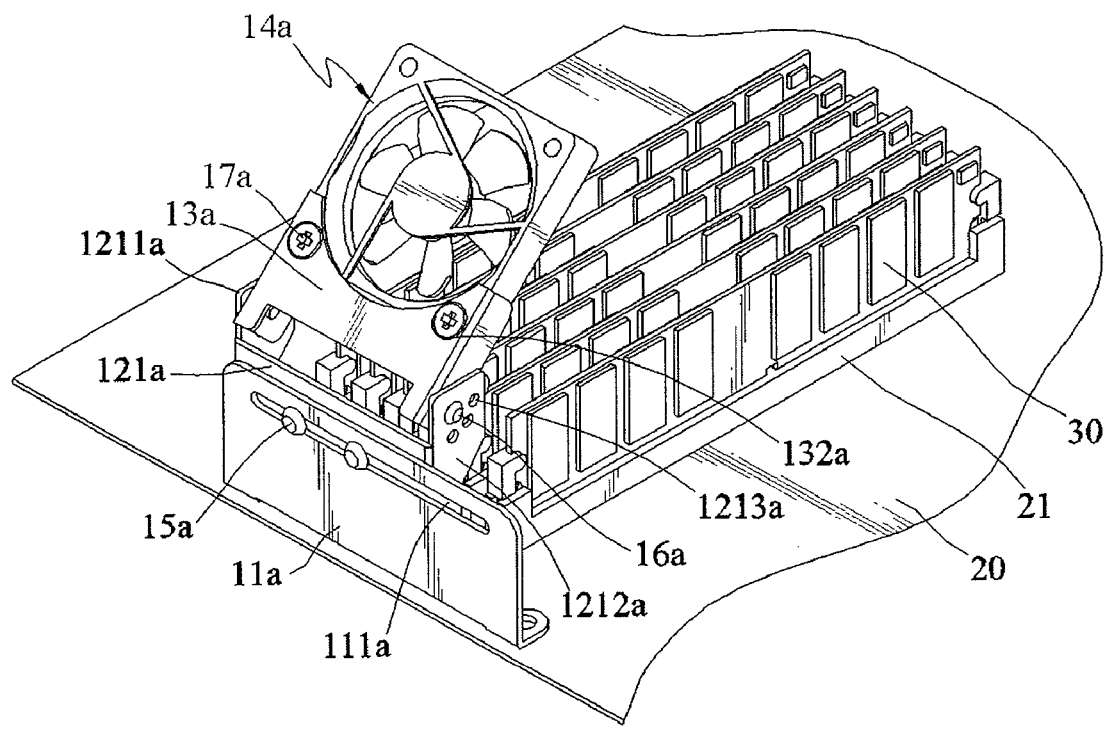
Figure 8C:
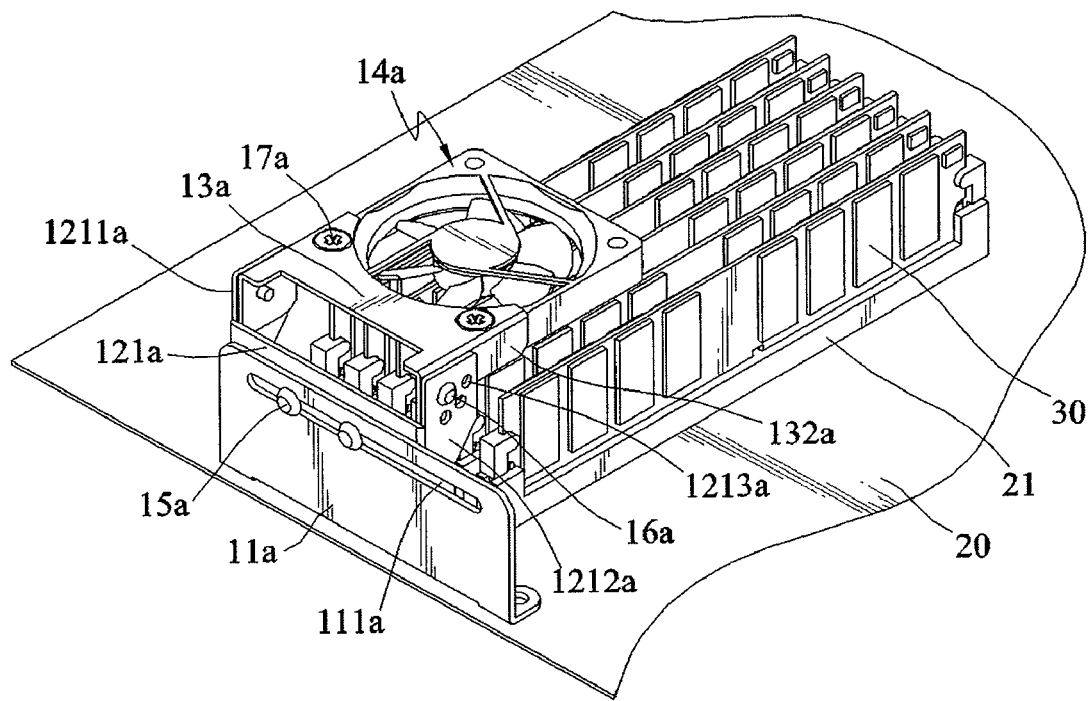
Figure 8D:
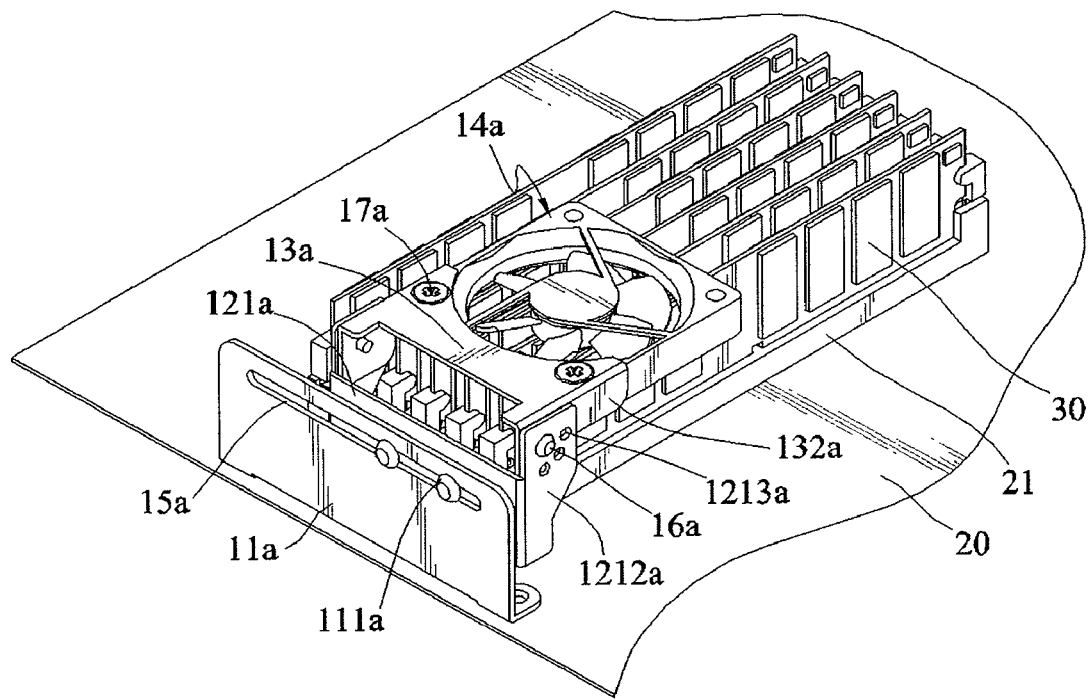

As shown in FIG. 5, according to a second embodiment of the present invention, a heat dissipation device 10a comprises a base frame 11a, a moving frame 12a, a retaining cover 13a, and a heat dissipation fan 14a. The base frame 11a assumes a plate shape and erects at one side of the memory socket 21 on the motherboard 20. A guide slot 111a is opened on the base frame 11a. The moving frame 12a comprises a main board 121a and wing plates 1211a and 1212a disposed on both sides of the main board 121a. The wing plate 1211a has a plurality of positioning holes 1213a (the wing plate 1212a is the same as the wing plate 1211a). The retaining cover 13a substantially assumes a U shape and has a pair of pivoting ears 131a and 132a. The pitch between the pivoting ears 131a and 132a is slightly smaller than the pitch between the wing plates 1211a and 1212a. The pivoting ear 131a has a positioning bump 1311a (the pivoting ear 132a is the same as the pivoting ear 131a). Furthermore, the retaining cover 13a has a plurality of perforations 1312a and 1313a. Referring to FIGS. 6 and 7 together, the moving frame 12a is movably disposed in a guide slot 11a of the base frame 11a by the use of two guide pins 15a, such that the moving frame 12a can move left and right on the base frame 11a. The retaining cover 13a is fitted on the moving frame 12a by the use of a pivot axle 16a penetrating the positioning hole 1213a and the perforations 1312a, such that the retaining cover 13a is rotatably pivoted to the moving frame 12a, and is positioned through the matching between the positioning hole 1213a and the positioning bump 1311a. Finally, the heat dissipation fan 14a is fixed on the retaining cover 13a by the fixing pin 17a penetrating the perforations 1313a.

Referring to FIGS. 8A to 8D together, the heat dissipation fan 14a rotates on the moving frame 12a by the use of the retaining cover 13a, such that the retraction position of the heat dissipation fan 14a erecting on the moving frame 12a, the first heat dissipation position of the heat dissipation fan 14a being beveled, and the second heat dissipation position of the heat dissipation fan 14a being horizontally disposed above the memory 30 can be respectively defined. Furthermore, the heat dissipation fan 14a can move left and right on the base frame 11a by the use of the moving frame 12a. As such, the optimal retraction position or heat dissipation position can be obtained by changing the transverse positions of the retraction position, the first heat dissipation position, and the second heat dissipation position.

The heat dissipation device provided by the present invention is fixed at one side of a memory socket. With the design of the movable heat dissipation fan, the heat dissipation fan can be easily moved to the retraction position or the heat dissipation position without being completely detached from a motherboard. Furthermore, with the design of the movable heat dissipation fan, the optimal heat dissipation mode can be selected, and only one heat dissipation fan is adopted to dissipate heat from the memory, thereby reducing the cost of the components, and thus this design is the optimal design of the heat dissipation device of the memory.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat dissipation device for dissipating heat from an electronic component, comprising:
    a moving frame, disposed at one side of the electronic component;
    a retaining cover, rotatably pivoted to the moving frame and having a heat dissipation fan mounted thereon; and
    a base frame with a guide slot, wherein the moving frame is disposed on the base frame and is movably combined with the guide slot with two guide pins such that the moving frame is transversely movable along the base frame;
    wherein the heat dissipation fan rotates and changes position through the moving frame and has at least a retraction position where the heat dissipation fan is not overlaid above the electronic components, and a heat dissipation position where the heat dissipation fan blows air flow towards the electronic components.

2. The heat dissipation device as claimed in claim 1, wherein when the retaining cover rotates to erect on the moving frame, the heat dissipation fan is in the retraction position, when the retaining cover rotates to be beveled, the heat dissipation fan is in the heat dissipation position which is defined to be a first heat dissipation position, and when the retaining cover rotates to a horizontal position, the heat dissipation fan is in the heat dissipation position which is defined to be the second heat dissipation position.

3. The heat dissipation device as claimed in claim 1, wherein the moving frame has a pair of wing plates, the retaining cover has a pair of pivoting ears, a pivot axle passes through the wing plates and the pivoting ears, such that the retaining cover is rotatably pivoted to the moving frame, and the wing plate has a positioning hole and the pivoting ear comprises a positioning bump to fix the retraction position and the heat dissipation position.

4. A heat dissipation device for dissipating heat from an electronic component, comprising:
    a moving frame, disposed at one side of the electronic component; and
    a retaining cover, rotatably pivoted to the moving frame and having a heat dissipation fan mounted thereon;
    wherein the heat dissipation fan rotates and changes position through the moving frame and has at least a retraction position where the heat dissipation fan is not overlaid above the electronic components and the retaining cover rotates to erect on the moving frame, a first heat dissipation position for blowing air flow toward the electronic component where the retaining cover rotates to be beveled and a second heat dissipation position for blowing air flow toward the electronic component where the retaining cover rotates to a horizontal position.

5. The heat dissipation device as claimed in claim 4, further comprising a base frame, wherein the moving frame is disposed on and transversely moves along the base frame.

6. The heat dissipation device as claimed in claim 4, wherein the moving frame has a pair of wing plates, the retaining cover has a pair of pivoting ears, a pivot axle passes through the wing plates and the pivoting ears, such that the retaining cover is rotatably pivoted to the moving frame, and the wing plate has a positioning hole and the pivoting ear comprises a positioning bump to fix the retraction position, the first heat dissipation position, and the second heat dissipation position.

7. A heat dissipation device for dissipating heat from an electronic component, comprising:
    a moving frame, disposed at one side of the electronic component and having a pair of wing plates; and
    a retaining cover, rotatably pivoted to the moving frame and, having a heat dissipation fan mounted thereon, and having a pair of pivoting ears;
    wherein a pivot axle passes through the wing plates and the pivoting ears, such that the retaining cover is rotatably pivoted to the moving frame, the heat dissipation fan rotates and changes position through the moving frame and has at least a retraction position where the heat dissipation fan is not overlaid above the electronic components, and a heat dissipation position where the heat dissipation fan blows air flow towards the electronic components, and the wing plate has a positioning hole and the pivoting ear comprises a positioning bump to fix the retraction position and the heat dissipation position.

8. The heat dissipation device as claimed in claim 7, further comprising a base frame, wherein the moving frame is disposed on and transversely moves along the base frame.

* * * * *